United States Patent [19]
Honda et al.

[11] Patent Number: 5,360,837
[45] Date of Patent: Nov. 1, 1994

[54] SEMICONDUCTOR DEVICE-ENCAPSULATING EPOXY RESIN COMPOSITION

[75] Inventors: Shiro Honda; Yasushi Sawamura; Masayuki Tanaka; Keiji Kayaba; Toshihiro Teshiba, all of Aichi, Japan

[73] Assignee: Toray Industries, Inc., Japan

[21] Appl. No.: 990,000

[22] Filed: Dec. 11, 1992

Related U.S. Application Data

[63] Continuation of Ser. No. 675,491, Mar. 26, 1991, abandoned.

[30] Foreign Application Priority Data

| | | | |
|---|---|---|---|
| Apr. 4, 1990 | [JP] | Japan | 2-90018 |
| Jun. 18, 1990 | [JP] | Japan | 2-159231 |
| Jun. 18, 1990 | [JP] | Japan | 2-159233 |
| Nov. 30, 1990 | [JP] | Japan | 2-339721 |

[51] Int. Cl.$^5$ ............................................. C08K 7/08
[52] U.S. Cl. .................................. 523/220; 523/223; 523/427; 523/434; 523/443
[58] Field of Search ............... 523/220, 223, 443, 427, 523/434

[56] References Cited

PUBLICATIONS

Translated copy of Japan Kokai 2-99514.

*Primary Examiner*—Frederick Krass
*Attorney, Agent, or Firm*—Austin R. Miller

[57] ABSTRACT

Disclosed is a semiconductor device-encapsulating epoxy resin composition comprising (i) an epoxy resin (A) containing at least one of a bifunctional epoxy resin (a1) having a biphenyl skeleton and a bifunctional epoxy resin (a2) having a naphthalene skeleton, (ii) a curing agent (B), and (iii) a filler containing fused silica (C) having a specified kind and specified mean particle diameter. This composition has an excellent heat resistance of solder, and further reliability after thermal cycles and reliability after solder-bath dipping.

7 Claims, No Drawings

5,360,837

SEMICONDUCTOR DEVICE-ENCAPSULATING EPOXY RESIN COMPOSITION

This application is a continuation of application Ser. No. 07/675,491 filed Mar. 26, 1991 now abandoned.

BACKGROUND OF THE INVENTION

1. Field of the Invention

This invention relates to an epoxy resin composition having good heat resistance of solder and further having excellent reliability.

2. Description of the Prior Art

Epoxy resins have excellent heat resistance, moisture resistance, electrical characteristics and adhesion properties, and they can acquire various characteristics on modifying the recipes thereof. Accordingly, therefore, epoxy resins are used in paints, adhesives, and industrial materials such as electrically insulating materials.

As methods of encapsulating electronic circuit parts such as semiconductor devices, there have been proposed a hermetic encapsulating method using metals or ceramics, and a resin encapsulating method using phenolic resin, silicone resin, epoxy resin or the like. From the view point of balancing economy, productivity and physical properties, however, the resin encapsulating method using an epoxy resin is mainly adopted.

On the other hand, integration and automated processing have recently been promoted in the step of mounting parts to a circuit board, and a "surface mounting method" in which a semiconductor device is soldered to the surface of a board has been frequently employed in place of the conventional "insertion mounting method" in which lead pins are inserted into holes of a board. Packages are correspondingly in a transient stage of from conventional dual inline package (DIP) to thin-type flat plastic package (FPP) suitable for integrated mounting and surface mounting.

As with the transition to the surface mounting method, the soldering process which conventionally has not attracted attention has now come to be a serious problem. According to the conventional pin insertion-mounting method, only a lead part is partially heated during soldering, whereas according to the surface mounting method a package in its entirety is dipped and heated in a heated solvent. As the soldering method for the surface mounting method, there are used solder-bath dipping method, solder reflow method in which heating is carried out with inert-liquid saturated vapor and infrared ray, and the like. By any of the methods, a package in its entirety is to be heated at a high temperature of 210° to 270° C. Accordingly, in a package encapsulated with a conventional encapsulating resin, a problematic cracking of the resin portion occurs at the soldering step, whereby the reliability is lost, and hence, the obtained product cannot be practically used.

The occurrence of cracking during the soldering process is regarded due to the explosive vaporization and expansion, at heating for soldering, of the moisture absorbed in the time period from procuring to the mounting process. For the countermeasure, there is employed a method to completely dry up a post-cured package and enclose it in a hermetically sealed container for shipping.

The improvement of encapsulating resins has been investigated in a wide variety of ways. For example, heat resistance of solder can be improved by a method of adding an epoxy resin having a biphenyl skeleton and a rubber component (Japanese Unexamined Patent Publication No. 251419/1988), but it is not sufficient. The method of adding an epoxy resin having a biphenyl skeleton and microparticles in powder of a particle diameter less than 14 μm (Japanese Unexamined Patent Publication No. 87616/1989) does not yield a satisfactory level of heat resistance of solder.

Alternatively, there has been proposed the addition of spherical fused silica microparticles (Japanese Unexamined Patent Publication No. 263131/1989), whereby only the fluidity of encapsulating resins is improved and the heat resistance of solder is not sufficient.

SUMMARY OF THE INVENTION

One of the objects of the present invention is to solve the problem concerning the occurrence of cracking during the soldering process, namely to provide an epoxy resin composition having excellent heat resistance of solder.

Another object of the present invention is to provide an epoxy resin composition having both of excellent heat resistance of solder and reliability after thermal cycles.

Other object of the present invention is to provide an epoxy resin composition having both excellent heat resistance of solder and reliability after solder-bath dipping.

Such objects in accordance with the present invention can be achieved by a semiconductor device-encapsulating epoxy resin composition comprising (i) an epoxy resin (A) containing as the essential component thereof at least one of a bifunctional epoxy resin (a1) having a biphenyl skeleton and a bifunctional epoxy resin (a2) having a naphthalene skeleton, (ii) a curing agent, and (iii) a filler containing a fused silica (C) consisting of 97 to 50 wt % of crushed fused silica (C1) of a mean particle diameter not more than 10 μm and 3 to 50 wt % of spherical fused silica (C2) of a mean particle diameter not more than 4 μm, wherein the mean particle diameter of the spherical fused silica is smaller than the mean particle diameter of the crushed fused silica, and the amount of the filler being 75 to 90 wt % of the total of the composition. The objects can be achieved by further allowing the composition to contain a styrene type block copolymer (D), or a copolymer (E) of (1) at least one compound selected from the group consisting of ethylene and α-olefin and (2) at least one compound selected from the group consisting of unsaturated carboxylic acid and derivatives thereof.

DESCRIPTION OF THE PREFERRED EMBODIMENT

In accordance with the present invention, it is important that an epoxy resin (A) contains as the essential component thereof at least one of a bifunctional epoxy resin (a1) having a biphenyl skeleton and a bifunctional epoxy resin (a2) having a naphthalene skeleton, and that a filler containing a fused silica (C) is contained at 75 to 90 wt % to the total of the composition. The fused silica (C) consists of 97 to 50 wt % of crushed fused silica (C1) of a mean particle diameter not more than 10 μm and 3 to 50 wt % of spherical fused silica (C2) of a mean particle diameter not more than 4 μm wherein the mean particle diameter of the spherical fused silica is smaller than the mean particle diameter of the crushed fused silica. Due to the bifunctionality of the epoxy resins (a1) and (a2), crosslinking density can be lowered. Biphenyl and naphthyl skeletons with high resistance to heat are contained, whereby there are obtained the effect of reducing the water absorption potency of the cured epoxy resin, as well as the effect of making the cured epoxy resin tough at a higher temperature (a solder-treating temperature). The through-out use of the fused silica of a smaller particle diameter can prevent the localization of internal stress imposed on the cured epoxy resin. By making the spherical fused silica of a smaller mean particle diameter present among the crushed silica of a small mean particle diameter, the internal stress being imposed on the cured epoxy resin can be reduced more greatly. Consequently, there is obtained an effect of improving the strength of the cured epoxy resin, in particular the strength at a high temperature (at the solder-treating temperature). According to the present invention, the independent effects of the epoxy resin and the silica are simultaneously brought about to produce a synergistic, remarkable effect on heat resistance of solder, far beyond expectation.

The epoxy resin (A) to be used in accordance with the present invention contains as the essential component thereof at least one of a bifunctional epoxy resin (a1) having a biphenyl skeleton and a bifunctional epoxy resin (a2) having a naphthalene skeleton.

The effect of preventing the occurrence of cracking during the soldering process cannot be exhibited in cases where the epoxy resins (a1) and (a2) are not contained.

The epoxy resin (a1) of the present invention includes a compound represented by the following formula (I):

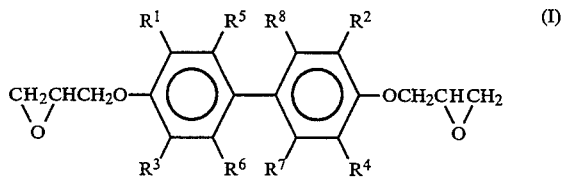

wherein $R_1$ through $R_8$ independently represent hydrogen atom, halogen atom or a lower alkyl group having 1 to 4 carbon atoms.

As preferred specific examples of $R^1$ through $R^8$ in the above-mentioned formula (I), there can be mentioned hydrogen atom, methyl group, ethyl group, propyl group, i-propyl group, n-butyl group, sec-butyl group, tert-butyl group, chlorine atom and bromine atom.

As preferred examples of the epoxy resin (a1), there can be mentioned 4,4'-bis(2,3-epoxypropoxy)biphenyl, 4,4'-bis(2,3 -epoxypropoxy)-3,3',5,5'-tetramethylbiphenyl, 4,4'-bis(2,3-epoxypropoxy)-3,3',5,5'-tetramethyl-2-chlorobiphenyl, 4,4'-bis(2,3-epoxypropoxy)-3,3',5,5'-tetramethyl-2-bromobiphenyl, 4,4'-bis(2,3-epoxypropoxy)-3,3',5,5'-tetraethylbiphenyl, and 4,4'-bis(2,3-epoxypropoxy)-3,3',5,5'-tetrabutylbiphenyl.

As particularly preferable examples, there can be mentioned 4,4'bis(2,3-epoxypropoxy)biphenyl, and 4,4'-bis(2,3-epoxypropoxy)-3,3',5,5'-tetramethylbiphenyl.

In accordance with the present invention, the epoxy resin (a2) includes a compound represented by the following formula (II):

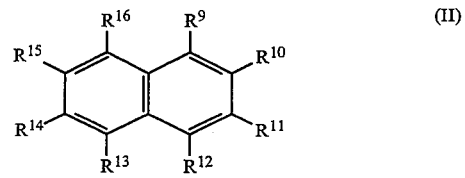

wherein two of $R^9$ to $R^{16}$, independently represent a group represented by

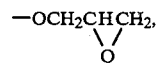

and those remaining independently represent hydrogen atom, halogen atom or a lower alkyl group having 1 to 4 carbon atoms.

Those among $R^9$ to $R^{16}$, excluding the two representing the group

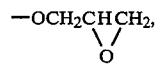

independently represent hydrogen atom, halogen atom or a lower alkyl group having 1 to 4 carbon atoms. As specifically preferable examples, there can be mentioned hydrogen atom, methyl group, ethyl group, propyl group, t-propyl group, n-butyl group, sec-butyl group, tert-butyl group, chlorine atom and bromine atom.

As preferred specific examples of the epoxy resin (a2), there can be mentioned 1,5-di(2,3-epoxypropoxy)-naphthalene, 1,5-di(2,3-epoxypropoxy)-7-methylnaphthalene, 1,6-di(2,3 -epoxypropoxy)naphthalene, 1,6-di(2,3-epoxypropoxy)-2-methylnaphthalene, 1,6-di(2,3-epoxypropoxy)-8-methylnaphthalene, 1,6-di(2,3-epoxypropoxy)-4,8-dimethylnaphthalene, 2-bromo-1,6-di(2,3-epoxypropoxy)naphthalene, 8-bromo-1,6-di(2,3-epoxypropoxy)naphthalene, 2,7-di(2,3-epoxypropoxy)naphthalene, etc. As particularly preferred examples, there can be mentioned 1,5-di(2,3-epoxypropoxy)naphthalene, 1,6-di(2,3-epoxypropoxy)naphthalene and 2,7-di(2,3-epoxypropoxy)naphthalene.

The epoxy resin (A) of the present invention can contain epoxy resins other than the epoxy resins (a1) and (a2), in combination with the epoxy resins (a1) and (a2). As the other epoxy resins concurrently usable, there can be mentioned cresol-novolac type epoxy resin, phenol-novolac type epoxy resin, various novolac type epoxy resins synthesized from bisphenol A, resorcine, etc., bisphenol A type epoxy resin, linear aliphatic epoxy resin, alicyclic epoxy resin, heterocyclic epoxy resin, halogenated epoxy resin, etc.

There is no specific limitation to the ratio of the epoxy resins (a1) and (a2) to be contained in the epoxy resin (A), and the effects of the present invention can be exerted only if the epoxy resin. (a1) or (a2) is contained as the essential component. In order to exert the effects more sufficiently, either one or both of the epoxy resins (a1) and (a2) should be contained in total at 50 wt % or more in the epoxy resin (A), preferably 70 wt % or more in the epoxy resin (A).

In accordance with the present invention, the compounding amount of the epoxy resin (A) is generally 4 to 20 wt %, preferably 6 to 18 wt % to total of the composition.

No specific limitation is imposed on the curing agent (B) in accordance with the present invention, so long as the agent reacts with the epoxy resin (A) and cures the resin. As specific examples of them, there can be mentioned phenol type curing agents including phenol-novolac resin, cresol-novolac resin, various novolac resins synthesized from bisphenol A, resorcine, etc., phenol alkylallylic resin represented by the following formula:

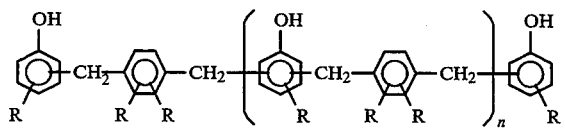

wherein n is an integer not less than 0; R is hydrogen atom or a lower alkyl group having 1 to 4 carbon atoms, all Rs being not necessarily identical, trihydroxyphenyl methane, etc.; acid anhydrides including maleic anhydride, phthalic anhydride, pyromellitic anhydride, etc.; aromatic amines including methaphenylene diamine, diaminodiphenyl methane, diaminodiphenyl sulfone, etc. For encapsulating a semiconductor device, there is preferably used a phenolic curing agent from the viewpoint of heat resistance, moisture resistance and storage stability; there are particularly preferably used phenol-novolac resin, phenol alkylallylic resin, trihydroxyphenyl methane, etc. Depending on the use, two or more curing agents may be used in combination.

According to the present invention, the mixing amount of the curing agent (B) is generally 3 to 15 wt %, preferably 4 to 10 wt % to the total of the composition. In view of mechanical properties and moisture resistance. The compounding amount of the epoxy resin (A) and the curing agent (B) is such that the chemical equivalent ratio of the curing agent (B) to the epoxy resin (A) is in the range of 0.7 to 1.3, preferably in the range of 0.8 to 1.2.

In the present invention, a curing catalyst may be used for promoting the curing reaction between the epoxy resin (A) and the curing agent (B). Any compound capable of promoting the curing reaction can be used in the present invention without specific limitation. For example, there can be included imidazole compounds such as 2-methylimidazole, 2,4-dimethylimidazole, 2-ethyl-4-methylimidazole, 2-phenylimidazole, 2-phenyl-4-methylimidazole, 2-heptadecylimidazole; tertiary amine compounds such as triethylamine, benzyldimethylamine, α-methylbenzyldimethylamine, 2-(dimethylaminomethel)phenol, 2,4,6-tris(dimethylaminomethyl)phenol, and 1,8-diazabicyclo(5,4,0)undecene-7; organic metal compounds such as zirconium tetramethoxide, zirconium tetrapropoxide, tetrakis(acetylacetonate)zirconium and tri(acetylacetonate)aluminum; and organic phosphine compounds such as triphenylphosphine, trimethylphosphine, triethylphosphine, tributylphosphine, tri(p-methylphenyl)phosphine, and tri(nonylphenyl)phosphine. From the viewpoint of moisture resistance, an organic phosphine compound is preferable, and triphenylphosphine in particular is preferably used. A combination of two or more of these curing catalysts may be used, depending on the use. Preferably, the curing catalyst is incorporated in an amount of 0.5 to 5 parts by weight per 100 parts by weight of the epoxy resin (A).

In the present invention, the filler contains the fused silica (C).

The fused silica (C) in accordance with the present invention consists of 90 to 50 wt % of crushed fused silica of a mean particle diameter not more than 10 μm and 3 to 50 wt % of spherical fused silica of a mean particle diameter not more than 4 μm, wherein the mean particle diameter of the spherical fused silica is smaller than the mean particle diameter of the crushed fused silica. Preferably, the fused silica (C) in accordance with the present invention consists of 97 to 60 wt % of crushed fused silica of a mean particle diameter not more than 10 μm and 3 to 40 wt % of spherical fused silica of a mean particle diameter not more than 4 μm, wherein the mean particle diameter of the spherical fused silica is smaller than the mean particle diameter of the crushed fused silica. The crushed fused silica of a mean particle diameter exceeding 10 μm cannot yield satisfactory heat resistance of solder. There is no specific limitation to the crushed fused silica herein, as long as its mean particle diameter is not more than 10 μm. Crushed fused silica of a mean particle diameter 3 μm or more and 10 μm or less is preferably used, from the viewpoint of heat resistance of solder. A crushed fused silica of a mean particle diameter of not less than 3 μm and less than 7 μm is specifically preferably used. When the mean particle diameter of crushed fused silica comes to be 10 μm or less, two or more types of crushed fused silica, with different mean particle diameters, may be used in combination. The spherical fused silica of a mean particle diameter exceeding 4 μm cannot yield satisfactory heat resistance of solder. There is no specific limitation to the spherical fused silica, as long as its mean particle diameter is not more than 4 μm, but a spherical fused silica of a mean particle diameter of 0.1 μm or more and 4 μm or less is preferably used, in view of heat resistance of solder. When the mean particle diameter of spherical fused silica comes to be 4 μm or less, two or more types of spherical fused silica, with different mean particle diameters, may be used in combination. The mean particle diameter referred to herein means the particle diameter (median size) at which the cumulative weight reaches 50 wt %. As the measuring method of particle diameter, a particle diameter distribution measuring method of laser diffraction type is employed. As laser diffraction type measurement, there is used, for example, a Laser Granulometer Model 715 manufactured by CILAS Co., Ltd. In the fused silica (C), it is also important that the mean particle diameter of spherical fused silica is smaller than the mean particle diameter of crushed fused silica. In the case that the mean particle diameter of spherical fused silica is greater than the mean particle diameter of crushed fused silica, a composition with excellent heat resistance of solder cannot be obtained. The mean particle diameter of spherical fused silica smaller than the mean particle diameter of crushed fused silica is permissible, and preferably, the mean particle diameter of spherical fused silica is two-thirds or less of the mean particle diameter of crushed fused silica, more preferably half or less. Furthermore, in the case that the ratio of crushed fused silica to spherical fused silica is not in the above-mentioned range, a composition with excellent heat resistance of solder cannot be obtained.

In the present invention, the ratio of the fused silica (C) is at least 80, preferably at least 90 wt % to the total amount of the filler. The ratio of the filler is 75 to 90 wt %, more preferably 77 to 88 wt % to the total amount of the composition. When the ratio of the filler is less than 75 wt % or exceeds 90 wt % to the total amount of the composition or when the ratio of the fused silica (C) is less than 80 wt % to the total amount of the filler, heat resistance of solder is not sufficient.

To the epoxy resin composition of the present invention may be added, as filler, crystalline silica, calcium carbonate, magnesium carbonate, alumina. magnesia, clay, talc, calcium silicate, titanium oxide, antimony oxide, asbestos, geass fiber, etc., besides fused silica (C).

In accordance with the present invention, a polystyrene type block copolymer (D) is preferably used. The polystyrene type block copolymer (D) includes linear, parabolic or branched block copolymers comprising blocks of an aromatic vinyl hydrocarbon polymer having a glass transition temperature of at least 25° C., preferably at least 50° C., and blocks of a conjugated diene polymer having a glass transition temperature not higher than 0° C., preferably not higher than −25° C.

As the aromatic vinyl hydrocarbon, there can be mentioned styrone, α-methylstyrone, o-methylstyrene, p-methylstyrene, 1,3-dimethylstyrene, vinylnaphthalene, etc., and among them, styrone is preferably used.

As the conjugated diene, there can be mentioned butadiene (1,3-butadiene), isoprene (2-methyl-1,3-butadiene), methylisoprene (2,3-dimethyl-1,3-butadiene), 1,3-pentadiene, etc., and of these conjugated dienes, butadiene and isoprene are preferably used.

The proportion of the blocks of the aromatic vinyl hydrocarbon, which are blocks of the glass phase, in the block copolymer, is preferably 10 to 50 wt %, and the blocks of the conjugated diene polymer, which are blocks of the rubber phase, is preferably 90 to 50 wt %.

A great number of combinations of the blocks of the glass phase and the blocks of the rubber phase are usable and any of these combinations can be adopted. A diblock copolymer comprising a single block of rubber phase bonded to a single block of glass phase, and a triblock copolymer comprising blocks of the glass phase bonded to both ends of the intermediate block of the rubber phase are preferably used. In this case, the number averaged molecular weight of the block of the glass phase is preferably 1,000 to 100,000, more preferably 2,000 to 50,000, and the number averaged molecular weight of the block of the rubber phase is preferably 5,000 to 200,000, more preferably 10,000 to 100,000.

The polystyrene type block copolymer (D) can be prepared by the known living anion polymerization process, but the preparation thereof is not limited to this polymerization process. Namely, the polystyrene type block copolymer (D) can be produced also by a cationic polymerization process and a radical polymerization process.

The polystyrene type block copolymer (D) includes also a hydrogenated block copolymer formed by reducing parts of unsaturated bonds of the above-mentioned block copolymer by hydrogenation.

In this case, preferably not more than 25% of the aromatic double bonds of the blocks of the aromatic vinyl hydrocarbon polymer is hydrogenated, and not less than 80% of aliphatic double bonds of the blocks of the conjugated diene polymer is hydrogenated.

As preferable examples of the polystyrene type block copolymer (D), there can be mentioned polystyrene/-polybutadiene/polystyrene triblock copolymer(SBS), polystyrene/polyisoprene/polystyrene triblock copolymer(SIS), hydrogenated copolymer of SBS(SEBS), hydrogenated copolymer of SIS, polystyrene/isoprene diblock copolymer and hydrogenated copolymer of the polystyrene/isoprene diblock copolymer (SEP).

The amount of polystyrene type block copolymer (D) incorporated is generally 0.2 to 10 wt %, preferably 0.5 to 5 wt % to total of the composition. The effect of improving the heat resistance of solder and reliability on moisture resistance are not sufficient in case of less than 0.2 wt %, whereas the amount exceeding 10 wt % is not practical because molding gets hard due to the lowered fluidity.

In the case that polystyrene type block copolymer (D) is additionally used in the present invention, heat resistance of solder is thereby improved, and the reliability after thermal cycling is more improved. The reason is assumed to be in the synergistic action of the following two effects;

(1) Polystyrene type block copolymer (D) makes the cured epoxy resin hydrophobic.
(2) Over a wide temperature range, the block of the conjugated diene copolymer in the polystyrene type block copolymer reduces the internal stress generating between semiconductor chips and the cured epoxy resin.

In the present invention, it is preferred to use the copolymer (E) of (1) at least one compound selected from the group consisting of ethylene and α-olefin and (2) at least one compound selected from the group consisting of unsaturated carboxylic acid and derivatives thereof.

As a compound selected from the group consisting of the ethylene and α-olefin in the copolymer (E), there can be mentioned ethylene, propylene, butene-1, pentene-1, 4-methylpentene-1, octene-1, etc, and of these, ethylene is preferably used. Two or more species of ethylene or α-olefin may be concurrently used, depending on the use. As the unsaturated carboxylic acid, there can be mentioned acrylic acid, methacrylic acid, ethyl acrylic acid, crotonic acid, maleic acid, fumaric acid, itaconic acid, citraconic acid, butene dicarboxylic acid, etc. As the derivative thereof, there can be mentioned alkyl ester, glycidyl ester, acid anhydride or imide thereof. As specific examples, methyl acrylate, ethyl acrylate, propyl acrylate, butyl acrylate, methyl methacrylate, ethyl methacrylate, glycidyl acrylate, glycidyl methacrylate, glycidyl ethyl acrlylate, diglycidyl itaconate ester, diglycidyl citraconate ester, diglycidyl butene dicarboxylate ester, monoglycidyl butene dicarboxylate ester, maleic anhydride, itaconic anhydride, citraconic anhydride, maleic imide, N-phenylmaleic imide, itaconic imide, citraconic imide, etc., and of these, acrylic acid, methacrylic acid, glycidyl acrylate, glycidyl methacrylate, maleic anhydride are preferably used. These unsaturated carboxylic acids and the derivatives thereof may be used in combination with two or more.

In view of heat resistance of solder and moisture resistance, the copolymerizing amount of a compound selected from the group consisting of unsaturated carboxylic acid and derivatives thereof is preferably 0.01 to 50 wt %.

Preferably, the melt index of the copolymer (E), measured according to ASTM-D1238, is 0.1 to 5,000, more preferably 1 to 3,000, from the viewpoint of moldability and heat resistance of solder.

In view of heat resistance of solder and moisture resistance, the added amount of the copolymer of (E) is generally 0.1 to 10 wt %, preferably 0.5 to 5 wt %, more preferably 1 to 4 wt % to the total of the composition.

The copolymer (E) may be preliminarily made into powder, by means of grinding, crosslinking, and other means, in accordance with the present invention.

The copolymer (E) can be compounded by appropriate procedures. For example, there can be mentioned a method in which the copolymer is preliminarily melt mixed with the epoxy resin (A) or the curing agent (B) followed by addition of other components, a method in which the copolymer is compounded simultaneously with the epoxy resin (A), the curing agent (B) and other components.

In the case that the copolymer of (E) is used in the present invention, heat resistance of solder is thereby further improved and the reliability after dipping in a solder bath is much more improved. The reason is assumed to be due to the synergistic action of the following two effects;

(1) The copolymer makes the cured epoxy resin hydrophobic.

(2) Parts of the unsaturated carboxylic acid or a derivative thereof in the copolymer reacts with the epoxy resin or the curing agent to render the cured epoxy resin tough.

In view of the reliability, preferably the filler such as fused silica (C) is preliminarily surface treated with coupling agents including silane coupling agent and titanate coupling agent. Preferably, silane coupling agents such as epoxysilane, aminosilane, mercaptosilane, etc., are preferably used as the coupling agent.

A flame retardant such as a halogenated epoxy resin or phosphorus compounds, a flame retardant assistant such as antimony trioxide, a colorant such as carbon black or iron oxide, an elastomer such as silicone rubber, modified nitrile rubber, modified polybutadiene rubber, erc., a thermoplastic resin such as polyethylene, a release agent such as long-chain fatty acid, metal salt of long-chain fatty acid, ester of long-chain fatty acid, amide of long-chain fatty acid, paraffin wax, modified silicone oil, etc., and a crosslinking agent such as organic peroxide can be added to the epoxy resin composition of the present invention.

The epoxy resin composition of the present invention is preferably melt-kneaded. For example, the epoxy resin composition can be prepared by carrying out the melt-kneading according to a known kneading method using a Banbury mixer, a kneader, a roll, a single-screw or twin-screw extruder or a cokneader.

The present invention will now be described in detail with reference to the following examples.

EXAMPLES 1 to 20

Using fused silica of each of the compositions shown in Table 1, blending of the reagents was carried out at their mixing ratios shown in Table 2, by using a mixer. The blend was melt-kneaded using a twin-screw extruder having a barrel-preset temperature maintained at 90° C., and then cooled and pulverized to prepare an epoxy resin composition.

Using the composition, a test device was molded according to the low-pressure transfer molding method to evaluate the heat resistance of solder under the conditions described below.

Evaluation of Heat Resistance of Solder

Thirty-two each of 80-pin QFP (package size, 17×17×1.7 mm; silicone chip size, 9×9×0.5 mm) were molded and cured at 180° C. for 5 hours, followed by humidification at 85° C./85% RH for 50 hours. Then, sixteen of 80-pin QFP each was dipped into a solder bath heated at 260° C. for 10 seconds, while another sixteen of 80-pin QFP each was placed into a VPS (vapor phase solder reflow) furnace heated at 215° C. for 90 seconds. Those QFP with occurrence of cracking were judged defective.

The results are shown in Table 3.

As is shown in Table 3, the epoxy resin compositions of the present invention (Examples 1 to 20) have excellent heat resistance of solder.

TABLE 1

| | Compositions of fused silica | | | | Crushed fused silica/Spherical fused silica Ratio by weight |
|---|---|---|---|---|---|
| | Crushed fused silica | | Spherical fused silica | | |
| | Ratio by weight *1 (I/II/III/IV/V) | Mean particle diameter (μm) | Ratio by weight *2 (VI/VII/VIII) | Mean particle diameter (μm) | |
| Example 1 | 0/100/0/0/0 | 5.3 | 100/0/0 | 0.2 | 95/5 |
| Example 2 | 0/100/0/0/0 | 5.3 | 0/100/0 | 2.1 | 95/5 |
| Example 3 | 0/100/0/0/0 | 5.3 | 0/100/0 | 2.1 | 95/5 |
| Example 4 | 100/0/0/0/0 | 3.4 | 100/0/0 | 0.2 | 90/10 |
| Example 5 | 0/0/100/0/0 | 6.5 | 0/100/0 | 2.1 | 90/10 |
| Example 6 | 0/0/100/0/0 | 6.5 | 0/100/0 | 2.1 | 90/10 |
| Example 7 | 100/0/0/0/0 | 3.4 | 100/0/0 | 0.2 | 80/20 |
| Example 8 | 0/0/100/0/0 | 6.5 | 0/100/0 | 2.1 | 80/20 |
| Example 9 | 0/0/100/0/0 | 6.5 | 0/100/0 | 2.1 | 80/20 |
| Example 10 | 0/0/100/0/0 | 6.5 | 0/100/0 | 2.1 | 90/10 |
| Example 11 | 0/0/0/100/0 | 8.9 | 100/0/0 | 0.2 | 90/10 |
| Example 12 | 0/0/70/0/30 | 9.2 | 0/100/0 | 2.1 | 90/10 |
| Example 13 | 0/100/0/0/0 | 5.3 | 100/0/0 | 0.2 | 80/20 |
| Example 14 | 0/0/0/100/0 | 8.9 | 0/70/30 | 3.6 | 80/20 |
| Example 15 | 0/100/0/0/0 | 5.3 | 100/0/0 | 0.2 | 80/20 |
| Example 16 | 50/0/0/50/0 | 6.3 | 50/50/0 | 0.9 | 80/20 |
| Example 17 | 0/0/100/0/0 | 6.5 | 0/100/0 | 2.1 | 70/30 |
| Example 18 | 0/0/100/0/0 | 6.5 | 0/100/0 | 2.1 | 70/30 |
| Example 19 | 50/0/05/0/0 | 6.3 | 50/50/0 | 0.9 | 80/20 |
| Example 20 | 0/0/0/100/0 | 8.9 | 0/100/0 | 2.1 | 70/30 |

*1 Mean particle diameter of curshed fused silica (μm) [I: 3.4 II: 5.3 III: 6.5, IV: 8.9, V: 14.0]
*2 Mean particle diameter of spherical fused silica (μm) [VI: 0.2, VII: 2.1, VIII: 6.5]

TABLE 2

Epoxy Resin Compositions (wt %)

| | Epoxy resin | | | Curing agent | | |
|---|---|---|---|---|---|---|
| | 4,4'-Bis(2,3-epoxypropoxy)-3,3',5,5'-tetramethyl-biphenyl | 1,6-Di(2,3-epoxypropoxy)-naphthalene | Ortho-cresol novolac type epoxy resin of an epoxy equivalent of 200 | Phenol novolac resin of a hydroxyl group equivalent of 107 | Phenol alkylallylic resin of a hydroxyl group equivalent of 173 | Curing catalyst Triphenyl-phosphine |
| Example 1 | 9.4 | 0.0 | 0.0 | 6.3 | 0.0 | 0.2 |
| Example 2 | 9.4 | 0.0 | 0.0 | 6.3 | 0.0 | 0.2 |
| Example 3 | 0.0 | 8.5 | 0.0 | 7.2 | 0.0 | 0.2 |
| Example 4 | 8.8 | 0.0 | 0.0 | 5.9 | 0.0 | 0.2 |
| Example 5 | 8.1 | 0.0 | 0.0 | 5.6 | 0.0 | 0.2 |
| Example 6 | 0.0 | 7.2 | 0.0 | 6.5 | 0.0 | 0.2 |
| Example 7 | 8.1 | 0.0 | 0.0 | 5.6 | 0.0 | 0.2 |
| Example 8 | 6.7 | 0.0 | 1.7 | 5.3 | 0.0 | 0.2 |
| Example 9 | 0.0 | 5.0 | 3.3 | 5.4 | 0.0 | 0.2 |
| Example 10 | 0.0 | 6.0 | 0.0 | 0.0 | 7.7 | 0.2 |
| Example 11 | 7.6 | 0.0 | 0.0 | 5.1 | 0.0 | 0.2 |
| Example 12 | 7.6 | 0.0 | 0.0 | 5.1 | 0.0 | 0.2 |
| Example 13 | 7.6 | 0.0 | 0.0 | 5.1 | 0.0 | 0.2 |
| Example 14 | 7.6 | 0.0 | 0.0 | 5.1 | 0.0 | 0.2 |
| Example 15 | 0.0 | 6.7 | 0.0 | 6.0 | 0.0 | 0.2 |
| Example 16 | 7.1 | 0.0 | 0.0 | 4.6 | 0.0 | 0.2 |
| Example 17 | 7.1 | 0.0 | 0.0 | 4.6 | 0.0 | 0.2 |
| Example 18 | 0.0 | 6.1 | 0.0 | 5.6 | 0.0 | 0.2 |
| Example 19 | 3.3 | 3.3 | 0.0 | 5.1 | 0.0 | 0.2 |
| Example 20 | 6.0 | 0.0 | 0.0 | 3.8 | 0.0 | 0.1 |

| | Fused silica in Table 1 | Silane coupling agent γ-Glycidoxy-propyltri-methoxysilane | Flame Retardant Brominated phenol novolac type epoxy resin with an epoxy equivalent of 270 and a total bromine content of 36 wt % | Flame retardant assistant Antimony trioxide | Colorant Carbon black | Release agent Carnauba wax |
|---|---|---|---|---|---|---|
| Example 1 | 79 | 0.7 | 2.3 | 1.5 | 0.3 | 0.3 |
| Example 2 | 79 | 0.7 | 2.3 | 1.5 | 0.3 | 0.3 |
| Example 3 | 79 | 0.7 | 2.3 | 1.5 | 0.3 | 0.3 |
| Example 4 | 80 | 0.7 | 2.3 | 1.5 | 0.3 | 0.3 |
| Example 5 | 81 | 0.7 | 2.3 | 1.5 | 0.3 | 0.3 |
| Example 6 | 81 | 0.7 | 2.3 | 1.5 | 0.3 | 0.3 |
| Example 7 | 81 | 0.7 | 2.3 | 1.5 | 0.3 | 0.3 |
| Example 8 | 81 | 0.7 | 2.3 | 1.5 | 0.3 | 0.3 |
| Example 9 | 81 | 0.7 | 2.3 | 1.5 | 0.3 | 0.3 |
| Example 10 | 81 | 0.7 | 2.3 | 1.5 | 0.3 | 0.3 |
| Example 11 | 82 | 0.7 | 2.3 | 1.5 | 0.3 | 0.3 |
| Example 12 | 82 | 0.7 | 2.3 | 1.5 | 0.3 | 0.3 |
| Example 13 | 82 | 0.7 | 2.3 | 1.5 | 0.3 | 0.3 |
| Example 14 | 82 | 0.7 | 2.3 | 1.5 | 0.3 | 0.3 |
| Example 15 | 82 | 0.7 | 2.3 | 1.5 | 0.3 | 0.3 |
| Example 16 | 83 | 0.7 | 2.3 | 1.5 | 0.3 | 0.3 |
| Example 17 | 83 | 0.7 | 2.3 | 1.5 | 0.3 | 0.3 |
| Example 18 | 83 | 0.7 | 2.3 | 1.5 | 0.3 | 0.3 |
| Example 19 | 83 | 0.7 | 2.3 | 1.5 | 0.3 | 0.3 |
| Example 20 | 85 | 0.7 | 2.3 | 1.5 | 0.3 | 0.3 |

TABLE 3

Results of evaluation — Heat resistance of solder

| | Dipping in solder at 260° C. (Fraction defective) | Solder reflow at 215° C. (Fraction defective) |
|---|---|---|
| Example 1 | 2/16 | 2/16 |
| Example 2 | 2/16 | 2/16 |
| Example 3 | 3/16 | 0/16 |
| Example 4 | 0/16 | 2/16 |
| Example 5 | 0/16 | 0/16 |
| Example 6 | 0/16 | 0/16 |
| Example 7 | 0/16 | 2/16 |
| Example 8 | 4/16 | 2/16 |
| Example 9 | 6/16 | 2/16 |
| Example 10 | 0/16 | 0/16 |
| Example 11 | 0/16 | 0/16 |
| Example 12 | 2/16 | 1/16 |
| Example 13 | 0/16 | 0/16 |
| Example 14 | 3/16 | 0/16 |
| Example 15 | 0/16 | 0/16 |
| Example 16 | 1/16 | 0/16 |

TABLE 3-continued

| | Results of evaluation | |
|---|---|---|
| | Heat resistance of solder | |
| | Dipping in solder at 260° C. (Fraction defective) | Solder reflow at 215° C. (Fraction defective) |
| Example 17 | 0/16 | 0/16 |
| Example 18 | 2/16 | 0/16 |
| Example 19 | 0/16 | 0/16 |
| Example 20 | 4/16 | 0/16 |

COMPARATIVE EXAMPLES 1 to 10

Using fused silica of each of the compositions shown in Table 4, blending of the reagents was carried out at their mixing ratios shown in Table 5, by using a mixer. Epoxy resin compositions were produced as in Examples 1 through 20, and the compositions were subjected to the evaluation of heat resistance of solder.

The results are shown in Table 6 and Table 7.

As is shown in Table 6, all of the compositions with the incorporated amounts of fused silica being outside the range of the present invention (Comparative Examples 1 and 10), the compositions without containing the epoxy resin of the present invention (Comparative Examples 2 and 7), the compositions with the incorporated amounts of spherical fused silica being outside the range of the present invention (Comparative Examples 3, 4 and 9), the composition with the mean particle diameter of spherical fused silica being greater than the mean particle diameter of crushed fused silica (Comparative Example 5), and the compositions with the mean particle diameter of crushed fused silica or spherical fused silica being outside the range of the present invention (Comparative Examples 6 and 8), have much poorer heat resistance of solder in contrast to the epoxy resin compositions of the present invention.

As is shown in Table 7, more excellent heat resistance of solder can be obtained even at more strict conditions for evaluating heat resistance of solder, in the case that the mean particle diameter of crushed fused silica of the present invention is less than 7 μm (Examples 5, 7, 10, 13 and 15) than in the case that the mean particle diameter of crushed fused silica is 7 to 10 μm (Examples 11, 12 and 14).

TABLE 4

| | Compositions of fused silica | | | | Crushed fused silica/Spherical fused silica Ratio by weight |
|---|---|---|---|---|---|
| | Crushed fused silica | | Spherical fused silica | | |
| | Ratio by weight *1 (I/II/III/IV/V) | Mean particle diameter (μm) | Ratio by weight *1 (VI/VII/VIII) | Mean particle diameter (μm) | |
| Comparative Example 1 | 0/100/0/0/0 | 5.3 | 0/100/0 | 2.1 | 95/5 |
| Comparative Example 2 | 0/0/0/100/0 | 8.9 | 100/0/0 | 0.2 | 90/10 |
| Comparative Example 3 | 0/100/0/0/0 | 5.3 | 0/0/0 | — | 100/0 |
| Comparative Example 4 | 0/100/0/0/0 | 5.3 | 0/0/0 | — | 100/0 |
| Comparative Example 5 | 100/0/0/0/0 | 3.4 | 0/70/30 | 3.6 | 90/10 |
| Comparative Example 6 | 0/0/0/0/100 | 14.0 | 0/100/0 | 2.1 | 90/10 |
| Comparative Example 7 | 0//0/100/0/0 | 6.5 | 0/100/0 | 2.1 | 80/20 |
| Comparative Example 8 | 0/0/0/100/0 | 8.9 | 0/0/100 | 6.5 | 90/10 |
| Comparative Example 9 | 0/0/100/0/0 | 6.5 | 0/100/0 | 2.1 | 40/60 |
| Comparative Example 10 | 0/0/100/0/0 | 6.5 | 0/100/0 | 2.1 | 60/40 |

*1 Mean particle diameter of crushed fused silica (μm) [I: 3.4, II: 5.3, III: 6.5, IV: 8.9, V: 14.0]
*2 Mean particle diameter of spherical fused silica (μm) [VI: 0.2, VII: 2.1, VIII: 6.5]

the range of the present invention (Comparative Exam-

TABLE 5

| | Epoxy Resin Compositions (wt %) | | | | |
|---|---|---|---|---|---|
| | Epoxy resin | | | Curing agent | |
| | 4,4'-Bis(2,3-epoxypropoxy)-3,3', 5,5'-tetramethyl biphenyl | 1,6-Di(2,3-epoxypropoxy)-naphthalene | Ortho-cresol novolac type epoxy resin of an epoxy equivalent of 200 | Phenol novolac resin of a hydroxyl group equivalent of 107 | Curing catalyst Triphenyl-phosphine |
| Comparative Example 1 | 12.9 | 0.0 | 0.0 | 8.7 | 0.3 |
| Comparative Example 2 | 0.0 | 0.0 | 11.0 | 6.7 | 0.2 |
| Comparative Example 3 | 9.4 | 0.0 | 0.0 | 6.3 | 0.2 |
| Comparative Example 4 | 0.0 | 8.5 | 0.0 | 7.2 | 0.2 |
| Comparative Example 5 | 8.8 | 0.0 | 0.0 | 5.9 | 0.2 |
| Comparative Example 6 | 8.1 | 0.0 | 0.0 | 5.6 | 0.2 |
| Comparative Example 7 | 0.0 | 0.0 | 8.4 | 5.3 | 0.2 |
| Comparative Example 8 | 7.6 | 0.0 | 0.0 | 5.1 | 0.2 |
| Comparative Example 9 | 6.4 | 0.0 | 0.0 | 4.4 | 0.1 |
| Comparative Example 10 | 1.8 | 0.0 | 0.0 | 2.0 | 0.1 |

Flame Retardant Brominated

TABLE 5-continued

| | Epoxy Resin Compositions (wt %) | | | | | |
|---|---|---|---|---|---|---|
| | Fused silica in Table 4 | Silane coupling agent γ-Glycidoxy-propyltri-methoxysilane | phenol novolac type epoxy resin with an epoxy equivalent of 270 and a total bromine content of 36 wt % | Flame retardant assistant Antimony trioxide | Colorant Carbon black | Release agent Carnauba wax |
| Comparative Example 1 | 73 | 0.7 | 2.3 | 1.5 | 0.3 | 0.3 |
| Comparative Example 2 | 77 | 0.7 | 2.3 | 1.5 | 0.3 | 0.3 |
| Comparative Example 3 | 79 | 0.7 | 2.3 | 1.5 | 0.3 | 0.3 |
| Comparative Example 4 | 79 | 0.7 | 2.3 | 1.5 | 0.3 | 0.3 |
| Comparative Example 5 | 80 | 0.7 | 2.3 | 1.5 | 0.3 | 0.3 |
| Comparative Example 6 | 81 | 0.7 | 2.3 | 1.5 | 0.3 | 0.3 |
| Comparative Example 7 | 81 | 0.7 | 2.3 | 1.5 | 0.3 | 0.3 |
| Comparative Example 8 | 82 | 0.7 | 2.3 | 1.5 | 0.3 | 0.3 |
| Comparative Example 9 | 84 | 0.7 | 2.3 | 1.5 | 0.3 | 0.3 |
| Comparative Example 10 | 91 | 0.7 | 2.3 | 1.5 | 0.3 | 0.3 |

TABLE 6

| | Results of evaluation | |
|---|---|---|
| | Heat resistance of solder | |
| | Dipping in solder at 260° C. (Fraction defective) | Solder reflow at 215° C. (Fraction defective) |
| Comparative Example 1 | 16/16 | 16/16 |
| Comparative Example 2 | 16/16 | 16/16 |
| Comparative Example 3 | 11/16 | 10/16 |
| Comparative Example 4 | 16/16 | 12/16 |
| Comparative Example 5 | 9/16 | 15/16 |
| Comparative Example 6 | 16/16 | 9/16 |
| Comparative Example 7 | Melt-kneading was impossible; | evaluation impossible |
| Comparative Example 8 | 14/16 | 11/16 |
| Comparative Example 9 | 16/16 | 12/16 |
| Comparative Example 10 | Melt-kneading was impossible; | evaluation impossible |

TABLE 7

| | Results of evaluation | |
|---|---|---|
| | Heat ressitance of solder Dipping in solder at 260° C. | |
| | After 50-hour humidification (Fraction defective) | After 75-hour humidification (Fraction defective) |
| Example 5 | 0/16 | 0/16 |
| Example 7 | 0/16 | 0/16 |
| Example 10 | 0/16 | 0/16 |
| Example 11 | 0/16 | 4/16 |
| Example 12 | 2/16 | 6/16 |
| Example 13 | 0/16 | 0/16 |
| Example 14 | 3/16 | 6/16 |
| Example 15 | 0/16 | 0/16 |
| Comparative Example 2 | 16/16 | 16/16 |
| Comparative Example 6 | 16/16 | 16/16 |
| Comparative Example 8 | 14/16 | 16/16 |

EXAMPLES 21 to 38, COMPARATIVE EXAMPLES 11 to 16

Using the styrene type block copolymers each shown in Table 8 and the fused silica of each of the compositions shown in Table 9, blending of the reagents was carried out at their mixing ratios shown in Table 10, by using a mixer. Epoxy resin compositions were produced as in Examples 1 to 20.

Using the compositions, test devices were molded according to the low-pressure transfer molding method to evaluate the heat resistance of solder and reliability on moisture resistance after thermal cycling.

Evaluation of Heat Resistance of Solder

Sixteen 80-pin QFP were molded and post cured at 180° C. for 5 hours, followed by humidification at 85° C./85% RH for 48 hours, which were then dipped into a solder bath heated at 260° C. for 10 seconds. Those QFP with occurrence of cracking were judged defective.

Evaluation of Reliability on Moisture Resistance After Thermal Cycling

Twenty 16-pin DIP (package size, 19×6×3 mm) mounting a test element with aluminum wiring were molded and cured at 180° C. for 5 hours, followed by 100-time repetition of the thermal cycle from −55° C. to 150° C., which were then subjected to PCT at the condition of 143° C./100% RH. Then, the lifetime of the properties was determined in Weibull distribution.

The results are shown in Table 11.

As shown in Table 11, the epoxy resin compositions with the styrene type block copolymers added, in accordance with the present invention (Examples 21 to 34), have improved heat resistance of solder together with considerably improved reliability on moisture resistance after thermal cycling, compared with those compositions without styrene type block copolymers added (Examples 35 to 38).

All of the composition with the mean particle diameter of spherical fused silica greater than the size of crushed fused silica (Comparative Example 11), the composition without containing the spherical fused silica (Comparative Example 12), the compositions without containing the epoxy resin composition of the present invention (Comparative Examples 13 and 14), and the compositions of the mean particle diameter of crushed or spherical fused silica being outside the range of the present invention (Comparative Examples 15 and 16), even though the above compositions all contain styrene type block copolymers, have much poorer heat resistance of solder and reliability on moisture resistance after thermal cycling, in contrast to the epoxy resin compositions of the present invention.

TABLE 8

| Polystyrene type block copolymer | Copolymerized composition | Polymerized ratio of copolymers | | Solution viscosity (cps) 25° C. |
| --- | --- | --- | --- | --- |
| | | Styrene | Butadiene or isoprene | |
| I | Polystyrene/polybutadiene/polystyrene triblock copolymer | 40 | 60 | 2,500*1 |
| II | Hydrogenated polystyrene/polybutadiene/polystyrene triblock copolymer | 29 | 71 | 550*2 |
| III | Hydrogenated polystyrene/polybutadiene/polystyrene triblock copolymer | 13 | 87 | 1,100*2 |
| IV | Polystyrene/polyisoprene/polystyrene triblock copolymer | 21 | 79 | 1,300*1 |
| V | Hydrogenated polystyrene/polyisoprene diblock copolymer | 37 | 63 | 1,260*3 |

*1 25 wt % toluene solution
*2 20 wt % toluene solution
*3 15 wt % toluene solution

TABLE 9

| | Compositions of fused silica | | | | Crushed fused silica/Spherical fused silica Ratio by weight |
| --- | --- | --- | --- | --- | --- |
| | Crushed fused silica | | Spherical fused silica | | |
| | Ratio by weight *1 (I/II/III/IV/V) | Mean particle diameter (μm) | Ratio by weight *2 (VI/VII/VIII) | Mean particle diameter (μm) | |
| Example 21 | 0/0/100/0/0 | 6.5 | 100/0/0 | 0.2 | 95/5 |
| Example 22 | 30/0/70/0/0 | 6.0 | 50/50/0 | 0.9 | 95/5 |
| Example 23 | 100/0/0/0/0 | 3.4 | 100/0/0 | 0.2 | 90/10 |
| Example 24 | 0/0/100/0/0 | 6.5 | 0/100/0 | 2.1 | 80/20 |
| Example 25 | 0/0/100/0/0 | 6.5 | 0/100/0 | 2.1 | 80/20 |
| Example 26 | 0/0/100/0/0 | 8.9 | 0/100/0 | 2.1 | 70/30 |
| Example 27 | 0/0/0/100/0 | 8.9 | 100/0/0 | 0.2 | 90/10 |
| Example 28 | 0/0/0/100/0 | 8.9 | 100/0/0 | 0.2 | 90/10 |
| Example 29 | 0/0/0/100/0 | 8.9 | 0/70/30 | 3.6 | 90/10 |
| Example 30 | 0/0/100/0/0 | 6.5 | 0/100/0 | 2.1 | 70/30 |
| Example 31 | 0/0/0/100/0 | 8.9 | 0/100/0 | 2.1 | 80/20 |
| Example 32 | 0/0/0/100/0 | 8.9 | 0/100/0 | 2.1 | 80/20 |
| Example 33 | 0/0/100/0/0 | 6.5 | 0/100/0 | 2.1 | 80/20 |
| Example 34 | 0/0/100/0/0 | 6.5 | 0/100/0 | 2.1 | 80/20 |
| Comparative Example 11 | 100/0/0/0/0 | 3.4 | 0/70/30 | 3.6 | 90/10 |
| Comparative Example 12 | 0/0/0/100/0 | 8.9 | 0/0/0 | — | 100/0 |
| Comparative Example 13 | 0/0/0/100/0 | 8.9 | 100/0/0 | 0.2 | 90/10 |
| Comparative Example 14 | 0/0/0/100/0 | 8.9 | 0/100/0 | 2.1 | 70/30 |
| Comparative Example 15 | 0/0/0/0/100 | 14.0 | 0/100/0 | 2.1 | 80/20 |
| Comparative Example 16 | 0/0/0/100/0 | 8.9 | 0/0/100 | 6.5 | 80/20 |
| Example 35 | 0/0/100/0/0 | 6.5 | 0/100/0 | 2.1 | 80/20 |
| Example 36 | 0/0/0/100/0 | 8.9 | 100/0/0 | 0.2 | 90/10 |
| Example 37 | 0/0/100/0/0 | 6.5 | 0/100/0 | 2.1 | 70/30 |
| Example 38 | 0/0/0/100/0 | 8.9 | 0/100/0 | 2.1 | 80/20 |

*1 Mean particle diameter of crushed fused silica (μm) [I: 3.4, II: 5.3, III: 6.5, IV: 8.9, V: 14.0]
*2 Mean particle diameter of spherical fused silica (μm) [VI: 0.2, VII: 2.1, VIII: 6.5]

TABLE 10

| Epoxy Resin Compositions (wt %) | | | | | |
| --- | --- | --- | --- | --- | --- |
| Epoxy resin | | | Curing agent | | |
| 4,4'-Bis(2,3-epoxypropoxy)-3,3', 5,5'- | 1,6-Di(2,3- | Ortho-cresol novolac type epoxy resin of an epoxy | Phenol novolac resin of a hydroxyl group | Curing catalyst | Fused silica |

TABLE 10-continued

| | Epoxy Resin Compositions (wt %) | | | | | |
|---|---|---|---|---|---|---|
| | tetramethyl-biphenyl | epoxypropoxy)-naphthalene | equivalent of 200 | equivalent of 107 | Triphenyl-phosphine | in Table 9 |
| Example 21 | 9.8 | 0.0 | 0.0 | 5.9 | 0.2 | 78 |
| Example 22 | 10.4 | 0.0 | 0.0 | 6.3 | 0.2 | 78 |
| Example 23 | 10.4 | 0.0 | 0.0 | 6.3 | 0.2 | 78 |
| Example 24 | 5.9 | 0.0 | 3.9 | 5.9 | 0.2 | 78 |
| Example 25 | 0.0 | 5.6 | 3.7 | 6.4 | 0.2 | 78 |
| Example 26 | 7.9 | 0.0 | 0.0 | 4.8 | 0.2 | 79 |
| Example 27 | 9.1 | 0.0 | 0.0 | 5.6 | 0.2 | 79 |
| Example 28 | 4.4 | 4.4 | 0.0 | 5.9 | 0.2 | 79 |
| Example 29 | 0.0 | 7.7 | 0.0 | 6.0 | 0.2 | 80 |
| Example 30 | 7.9 | 0.0 | 0.0 | 4.8 | 0.2 | 80 |
| Example 31 | 7.9 | 0.0 | 0.0 | 4.8 | 0.2 | 81 |
| Example 32 | 0.0 | 7.2 | 0.0 | 5.5 | 0.2 | 81 |
| Example 33 | 0.0 | 6.6 | 0.0 | 5.1 | 0.2 | 82 |
| Example 34 | 7.2 | 0.0 | 0.0 | 4.5 | 0.2 | 83 |
| Comparative Example 11 | 10.4 | 0.0 | 0.0 | 6.3 | 0.2 | 78 |
| Comparative Example 12 | 9.1 | 0.0 | 0.0 | 5.6 | 0.2 | 79 |
| Comparative Example 13 | 0.0 | 0.0 | 9.3 | 5.4 | 0.2 | 79 |
| Comparative Example 14 | 0.0 | 0.0 | 8.1 | 4.6 | 0.2 | 79 |
| Comparative Example 15 | 0.0 | 7.2 | 0.0 | 5.5 | 0.2 | 81 |
| Comparative Example 16 | 7.9 | 0.0 | 0.0 | 4.8 | 0.2 | 81 |
| Example 35 | 0.0 | 6.3 | 4.2 | 7.2 | 0.2 | 78 |
| Example 36 | 10.4 | 0.0 | 0.0 | 6.3 | 0.2 | 79 |
| Example 37 | 9.8 | 0.0 | 0.0 | 5.9 | 0.2 | 80 |
| Example 38 | 0.0 | 8.3 | 0.0 | 6.4 | 0.2 | 81 |

| | Silane coupling agent γ-Glycidoxy-propyltri-methoxysilane | Flame Retardant Tetrabromo-bisphenol A type epoxy resin with an epoxy equivalent of 400 and a total bromine content of 49 wt % | Flame retardant assistant Antimony trioxide | Colorant Carbon black | Release agent Carnauba wax | Styrene type block copolymer of Table 8 Type/Quantity |
|---|---|---|---|---|---|---|
| Example 21 | 0.5 | 1.5 | 1.5 | 0.3 | 0.3 | I: 2.0 |
| Example 22 | 0.5 | 1.5 | 1.5 | 0.3 | 0.3 | V: 1.0 |
| Example 23 | 0.5 | 1.5 | 1.5 | 0.3 | 0.3 | IV: 1.0 |
| Example 24 | 0.5 | 1.5 | 1.5 | 0.3 | 0.3 | V: 2.0 |
| Example 25 | 0.5 | 1.5 | 1.5 | 0.3 | 0.3 | V: 2.0 |
| Example 26 | 0.5 | 1.5 | 1.5 | 0.3 | 0.3 | II: 4.0 |
| Example 27 | 0.5 | 1.5 | 1.5 | 0.3 | 0.3 | III: 2.0 |
| Example 28 | 0.5 | 1.5 | 1.5 | 0.3 | 0.3 | III: 2.0 |
| Example 29 | 0.5 | 1.5 | 1.5 | 0.3 | 0.3 | III: 2.0 |
| Example 30 | 0.5 | 1.5 | 1.5 | 0.3 | 0.3 | III: 3.0 |
| Example 31 | 0.5 | 1.5 | 1.5 | 0.3 | 0.3 | V: 2.0 |
| Example 32 | 0.5 | 1.5 | 1.5 | 0.3 | 0.3 | V: 2.0 |
| Example 33 | 0.5 | 1.5 | 1.5 | 0.3 | 0.3 | II: 2.0 |
| Example 34 | 0.5 | 1.5 | 1.5 | 0.3 | 0.3 | II: 1.0 |
| Comparative Example 11 | 0.5 | 1.5 | 1.5 | 0.3 | 0.3 | IV: 1.0 |
| Comparative Example 12 | 0.5 | 1.5 | 1.5 | 0.3 | 0.3 | III: 2.0 |
| Comparative Example 13 | 0.5 | 1.5 | 1.5 | 0.3 | 0.3 | III: 2.0 |
| Comparative Example 14 | 0.5 | 1.5 | 1.5 | 0.3 | 0.3 | II: 4.0 |
| Comparative Example 15 | 0.5 | 1.5 | 1.5 | 0.3 | 0.3 | V: 2.0 |
| Comparative Example 16 | 0.5 | 1.5 | 1.5 | 0.3 | 0.3 | V 2.0 |
| Example 35 | 0.5 | 1.5 | 1.5 | 0.3 | 0.3 | 0.0 |
| Example 36 | 0.5 | 1.5 | 1.5 | 0.3 | 0.3 | 0.0 |
| Example 37 | 0.5 | 1.5 | 1.5 | 0.3 | 0.3 | 0.0 |
| Example 38 | 0.5 | 1.5 | 1.5 | 0.3 | 0.3 | 0.0 |

TABLE 11

| | Results of evaluation | |
|---|---|---|
| | Heat resistance of solder Dipping in solder at 260° C. (Fraction defective) | Reliability on moisture resistance PCT after thermal cycling (hr) |
| Example 21 | 0/16 | 300 |
| Example 22 | 0/16 | 310 |
| Example 23 | 0/16 | 300 |
| Example 24 | 1/16 | 290 |
| Example 25 | 1/16 | 290 |
| Example 26 | 1/16 | 320 |
| Example 27 | 0/16 | 330 |
| Example 28 | 0/16 | 300 |
| Example 29 | 1/16 | 280 |
| Example 30 | 0/16 | 310 |
| Example 31 | 0/16 | 330 |
| Example 32 | 0/16 | 310 |

TABLE 11-continued

| | Results of evaluation | |
|---|---|---|
| | Heat resistance of solder Dipping in solder at 260° C. (Fraction defective) | Reliability on moisture resistance PCT after thermal cycling (hr) |
| Example 33 | 0/16 | 300 |
| Example 34 | 0/16 | 280 |
| Comparative Example 11 | 13/16 | 150 |
| Comparative Example 12 | 14/16 | 140 |
| Comparative Example 13 | 16/16 | 140 |
| Comparative Example 14 | Melt-kneading was impossible; | evaluation impossible |
| Comparative Example 15 | 16/16 | 90 |
| Comparative Example 16 | 16/16 | 110 |
| Example 35 | 5/16 | 220 |
| Example 36 | 2/16 | 210 |
| Example 37 | 2/16 | 210 |
| Example 38 | 1/16 | 200 |

EXAMPLES 39 to 55, COMPARATIVE EXAMPLES 17 to 22

Using the copolymers (E) shown in Table 12, and the fused silica with the compositions shown in Table 13, blending of the reagents was carried out at their mixing ratios shown in Table 14, by using a mixer, to produce epoxy resin compositions as in Examples 1 to 20.

Using the compositions, test devices were molded according to the low-pressure transfer molding method, which were then subjected to the evaluation of heat resistance of solder and reliability on moisture resistance after dipping in solder.

Evaluation of Heat Resistance of Solder

Sixteen 80-pin QFP were molded and cured at 180° C. for 5 hours, followed by humidification at 85° C./85% RH for 48 hours, which were then dipped into a solder bath heated at 260° C. for 10 seconds. Those QFP with occurrence of cracking were judged defective.

Evaluation of Reliability on Moisture Resistance After Dipping in Solder

A test element with aluminum wiring was mounted on a 80-pin QFP and molded. The resulting test device was cured at 180° C. for 5 fours, followed by humidification at 85° C./85% RH for 48 hours, which was then dipped in a solder bath heated at 260° C. for 10 seconds. The test device after dipping in solder was subjected to PCT at the condition of 143° C./100% RH, whether or not cracking occurred in the test device. Then, the lifetime of the properties was determined in Weibull distribution.

The results are shown in Table 15 and Table 16.

As shown in Table 15, the epoxy resin compositions with the copolymers (E) being added, in accordance with the present invention (Examples 39 to 51), have improved heat resistance of solder together with considerably improved reliability on moisture resistance after solder dipping, compared with those compositions without copolymers (E) added (Examples 52 to 55).

All of the compositions without containing the epoxy resin composition of the present invention (Comparative Examples 17 and 21), the composition with the mean particle diameter of spherical fused silica greater than the size of crushed fused silica (Comparative Example 18), the compositions of the mean particle diameter of crushed or spherical fused silica being outside the range of the present invention (Comparative Examples 19 and 20), and the composition in which the ratio of spherical fused silica used is outside the range of the present invention (Comparative Example 22), even though the above compositions all contain the copolymers (E) have much poorer heat resistance of solder and reliability on moisture resistance after solder dipping.

Even when using 28-pin SOP instead of 80-pin QFP as test device and changing the testing condition as follows, the epoxy resin compositions of the present invention have been found to have excellent heat resistance of solder and reliability on moisture resistance after solder dipping, as is shown in Table 16.

Evaluation of Heat Resistance of Solder

A test element with aluminum wiring was mounted on a 28-pin SOP and molded. The resulting test device was cured at 180° C. for 5 hours, followed by humidification at 85° C./85% RH for 72 hours, which was then dipped in a solder bath heated at 260° C. for 10 seconds. Those SOP with the occurrence of cracking were judged defective.

Evaluation of Reliability on Moisture Resistance After Dipping in Solder

SOP after the evaluation of heat resistance of solder was subjected to PCT at the condition of 121° C./100% RH, whether or not cracking occurred therein. Then, it was determined the time at which the cumulative failure rate reached 50%.

TABLE 12

| | Copolymer (E) | | |
|---|---|---|---|
| Symbols | Copolymerized composition | Ratio by weight | Melt index (g/10 min) |
| I | Ethylene/ethyl acrylate | 75/25 | 50 |
| II | Ethylene/acrylic acid | 95/5 | 20 |
| III | Ethylene/ethyl acrylate/ maleic anhydride | 68/30/2 | 40 |
| IV | Ethylene/methyl methacrylate | 85/15 | 300 |
| V | Ethylene/glycidyl methacrylate | 90/10 | 10 |

TABLE 13

| | Compositions of fused silica | | | | |
|---|---|---|---|---|---|
| | Crushed fused silica | | Spherical fused silica | | Crushed fused |
| | Ratio by weight *1 (I/II/III/IV/V) | Mean particle diamerter (μm) | Ratio by weight *2 (VI/VII/VIII) | Mean particle diameter (μm) | silica/Spherical fused silica Ratio by weight |
| Example 39 | 0/100/0/0/0 | 5.3 | 100/0/0 | 0.2 | 95/5 |
| Example 40 | 0/100/0/0/0 | 5.3 | 0/100/0 | 2.1 | 95/5 |
| Example 41 | 100/0/0/0/0 | 3.4 | 100/0/0 | 0.2 | 90/10 |
| Example 42 | 0/0/100/0/0 | 6.5 | 0/100/0 | 2.1 | 90/10 |

TABLE 13-continued

| | Compositions of fused silica | | | | Crushed fused silica/Spherical fused silica Ratio by weight |
|---|---|---|---|---|---|
| | Crushed fused silica | | Spherical fused silica | | |
| | Ratio by weight *1 (I/II/III/IV/V) | Mean particle diamerter (μm) | Ratio by weight *2 (VI/VII/VIII) | Mean particle diameter (μm) | |
| Example 43 | 0/0/0/100/0 | 8.9 | 0/70/30 | 3.6 | 80/20 |
| Example 44 | 0/0/100/0/0 | 6.5 | 0/100/0 | 2.1 | 90/10 |
| Example 45 | 0/0/100/0/0 | 6.5 | 0/100/0 | 2.1 | 80/20 |
| Example 46 | 0/0/100/0/0 | 6.5 | 0/100/0 | 2.1 | 80/20 |
| Example 47 | 0/0/100/0/0 | 6.5 | 0/100/0 | 2.1 | 70/30 |
| Example 48 | 0/0/0/100/0 | 8.9 | 0/100/0 | 2.1 | 70/30 |
| Example 49 | 50/0/0/50/0 | 6.3 | 50/50/0 | 0.9 | 80/20 |
| Example 50 | 0/0/100/0/0 | 6.5 | 0/100/0 | 2.1 | 70/30 |
| Example 51 | 0/0/100/0/0 | 8.9 | 0/70/30 | 3.6 | 70/30 |
| Comparative Example 17 | 0/0/100/0/0 | 8.9 | 0/100/0 | 2.1 | 70/30 |
| Comparative Example 18 | 100/0/0/0/0 | 3.4 | 0/70/30 | 3.6 | 80/20 |
| Comparative Example 19 | 0/0/100/0/0 | 8.9 | 0/0/100 | 6.5 | 80/20 |
| Comparative Example 20 | 0/0/0/0/100 | 14.0 | 0/100/0 | 2.1 | 70/30 |
| Comparative Example 21 | 0/0/100/0/0 | 8.9 | 0/100/0 | 2.1 | 70/30 |
| Comparative Example 22 | 0/0/100/0/0 | 6.5 | 0/100/0 | 2.1 | 40/60 |
| Example 52 | 0/0/100/0/0 | 6.5 | 0/100/0 | 2.1 | 90/10 |
| Example 53 | 0/0/100/0/0 | 6.5 | 0/100/0 | 2.1 | 80/20 |
| Example 54 | 0/0/100/0/0 | 6.5 | 0/100/0 | 2.1 | 70/30 |
| Example 55 | 0/0/100/0/0 | 8.9 | 0/100/0 | 2.1 | 70/30 |

*1 Mean particle diameter of crushed fused silica (μm) [I:3.4, II:5.3, III:6.5, IV:8.9, V:14.0]
*2 Mean particle diameter of spherical fused silica (μm) [VI:0.2, VII:2.1, VIII:6.5]

TABLE 14

| | Epoxy Resin Compositions (wt %) | | | | | |
|---|---|---|---|---|---|---|
| | Epoxy resin | | | Curing agent | | |
| | 4,4'-Bis(2,3-epoxypropoxy)-3,3', 5,5'-tetramethyl-biphenyl | 1,6-Di(2,3-epoxypropoxy)-naphthalene | Ortho-cresol novolac type epoxy resin of an epoxy equivalent of 200 | Phenol novolac resin of a hydroxyl group equivalent of 107 | Curing catalyst Triphenyl-phosphine | Fused silica in Table 9 |
| Example 39 | 9.2 | 0.0 | 0.0 | 6.0 | 0.2 | 78 |
| Example 40 | 9.2 | 0.0 | 0.0 | 6.0 | 0.2 | 79 |
| Example 41 | 8.5 | 0.0 | 0.0 | 5.7 | 0.2 | 79 |
| Example 42 | 7.9 | 0.0 | 0.0 | 5.3 | 0.2 | 80 |
| Example 43 | 7.2 | 0.0 | 0.0 | 5.0 | 0.2 | 80 |
| Example 44 | 0.0 | 7.0 | 0.0 | 6.2 | 0.2 | 80 |
| Example 45 | 6.4 | 0.0 | 1.6 | 5.2 | 0.2 | 81 |
| Example 46 | 0.0 | 6.1 | 1.5 | 5.6 | 0.2 | 81 |
| Example 47 | 7.2 | 0.0 | 0.0 | 5.0 | 0.2 | 81 |
| Example 48 | 6.0 | 0.0 | 0.0 | 4.2 | 0.2 | 81 |
| Example 49 | 3.1 | 3.1 | 0.0 | 5.0 | 0.2 | 82 |
| Example 50 | 0.0 | 5.5 | 0.0 | 4.8 | 0.2 | 83 |
| Example 51 | 4.7 | 0.0 | 0.0 | 3.5 | 0.2 | 86 |
| Comparative Example 17 | 0.0 | 0.0 | 8.7 | 5.5 | 0.2 | 77 |
| Comparative Example 18 | 7.2 | 0.0 | 0.0 | 5.0 | 0.2 | 80 |
| Comparative Example 19 | 7.2 | 0.0 | 0.0 | 5.0 | 0.2 | 80 |
| Comparative Example 20 | 7.2 | 0.0 | 0.0 | 5.0 | 0.2 | 81 |
| Comparative Example 21 | 0.0 | 0.0 | 6.2 | 4.0 | 0.2 | 81 |
| Comparative Example 22 | 0.0 | 5.5 | 0.0 | 4.8 | 0.2 | 83 |
| Example 52 | 0.0 | 8.3 | 0.0 | 6.9 | 0.2 | 80 |
| Example 53 | 0.0 | 6.5 | 1.6 | 6.1 | 0.2 | 81 |
| Example 54 | 8.5 | 0.0 | 0.0 | 5.7 | 0.2 | 81 |
| Example 55 | 8.5 | 0.0 | 0.0 | 5.7 | 0.2 | 81 |

| | Silane coupling agent γ-Glycidoxy propyltri-methoxysilane | Flame Retardant Brominated phenol novalac type epoxy resin with an epoxy equivalent of 270 and a total bromine content of 36 wt % | Flame retardant assistant Antimony trioxide | Colarant Carbon black | Release agent Carnauba wax | Copolymer of Table 12 Type/Quantity |
|---|---|---|---|---|---|---|
| Example 39 | 0.7 | 2.3 | 1.0 | 0.3 | 0.3 | V: 2.0 |
| Example 40 | 0.7 | 2.3 | 1.0 | 0.3 | 0.3 | II: 1.0 |
| Example 41 | 0.7 | 2.3 | 1.0 | 0.3 | 0.3 | IV: 2.0 |
| Example 42 | 0.7 | 2.3 | 1.0 | 0.3 | 0.3 | III: 2.0 |
| Example 43 | 0.7 | 2.3 | 1.0 | 0.3 | 0.3 | II: 3.0 |

TABLE 14-continued

| Epoxy Resin Compositions (wt %) | | | | | | |
|---|---|---|---|---|---|---|
| Example 44 | 0.7 | 2.3 | 1.0 | 0.3 | 0.3 | III: 2.0 |
| Example 45 | 0.7 | 2.3 | 1.0 | 0.3 | 0.3 | III: 1.0 |
| Example 46 | 0.7 | 2.3 | 1.0 | 0.3 | 0.3 | III: 1.0 |
| Example 47 | 0.7 | 2.3 | 1.0 | 0.3 | 0.3 | V: 2.0 |
| Example 48 | 0.7 | 2.3 | 1.0 | 0.3 | 0.3 | IV: 4.0 |
| Example 49 | 0.7 | 2.3 | 1.0 | 0.3 | 0.3 | II: 2.0 |
| Example 50 | 0.7 | 2.3 | 1.0 | 0.3 | 0.3 | I: 2.0 |
| Example 51 | 0.7 | 2.3 | 1.0 | 0.3 | 0.3 | V: 1.0 |
| Comparative Example 17 | 0.7 | 2.3 | 1.0 | 0.3 | 0.3 | IV: 4.0 |
| Comparative Example 18 | 0.7 | 2.3 | 1.0 | 0.3 | 0.3 | II: 3.0 |
| Comparative Example 19 | 0.7 | 2.3 | 1.0 | 0.3 | 0.3 | III: 2.0 |
| Comparative Example 20 | 0.7 | 2.3 | 1.0 | 0.3 | 0.3 | V: 2.0 |
| Comparative Example 21 | 0.7 | 2.3 | 1.0 | 0.3 | 0.3 | IV: 4.0 |
| Comparative Example 22 | 0.7 | 2.3 | 1.0 | 0.3 | 0.3 | I: 2.0 |
| Example 52 | 0.7 | 2.3 | 1.0 | 0.3 | 0.3 | 0.0 |
| Example 53 | 0.7 | 2.3 | 1.0 | 0.3 | 0.3 | 0.0 |
| Example 54 | 0.7 | 2.3 | 1.0 | 0.3 | 0.3 | 0.0 |
| Example 55 | 0.7 | 2.3 | 1.0 | 0.3 | 0.3 | 0.0 |

TABLE 15

Results of evaluation

| | Heat resistance of solder Dipping in solder at 260° C. (Fraction defective) | Reliability on moisture resistance PCT after dipping in solder at 260° C. (hr) |
|---|---|---|
| Example 39 | 0/16 | 310 |
| Example 40 | 1/16 | 300 |
| Example 41 | 0/16 | 320 |
| Example 42 | 0/16 | 320 |
| Example 43 | 0/16 | 300 |
| Example 44 | 0/16 | 310 |
| Example 45 | 2/16 | 320 |
| Example 46 | 1/16 | 290 |
| Example 47 | 0/16 | 340 |
| Example 48 | 0/16 | 330 |
| Example 49 | 0/16 | 350 |
| Example 50 | 0/16 | 290 |
| Example 51 | 2/16 | 300 |
| Comparative Example 17 | 16/16 | 50 |
| Comparative Example 18 | 14/16 | 90 |
| Comparative Example 19 | 16/16 | 70 |
| Comparative Example 20 | 16/16 | 60 |
| Comparative Example 21 | Melt-kneading was impossible; | evaluation impossible |
| Comparative Example 22 | 10/16 | 110 |
| Example 52 | 0/16 | 220 |
| Example 53 | 4/16 | 190 |
| Example 54 | 2/16 | 240 |
| Example 55 | 2/16 | 230 |

TABLE 16

Results of evaluation

| | Heat resistance of solder Dipping in solder at 260° C. (Fraction defective) | Reliability on moisture resistance PCT after dipping in solder at 260° C. (hr) |
|---|---|---|
| Example 47 | 0/20 | 350 |
| Example 51 | 0/20 | 350 |
| Comparative Example 20 | 11/20 | 50 |

What we claim is:

1. A semiconductor device-encapsulating epoxy resin composition comprising
   (i) an epoxy resin (A) containing as the essential component thereof a bifunctional epoxy resin (a 1) having a biphenyl skeleton, represented by the following formula (I):

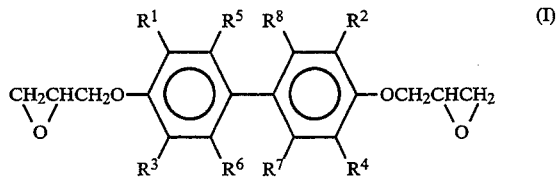

wherein $R^1$ through $R^8$ independently represent hydrogen atom, halogen atom or a lower alkyl group having 1 to 4 carbon atoms,
   (ii) a curing agent, and
   (iii) a filler containing a fused silica (C) consisting of 97 to 50 wt % of crushed fused silica (C1) of a mean particle diameter not more than 10 μm and 3 to 50 wt % of spherical fused silica (C2) of a mean particle diameter not more than 4 μm, wherein the mean particle diameter of the spherical fused silica is smaller than the mean particle diameter of the crushed fused silica, and the amount of the filler being 75 to 90 wt % to the total of the composition.

2. A semiconductor device-encapsulating epoxy resin composition comprising
   (i) an epoxy resin (A) containing as the essential component thereof a bifunctional epoxy resin (a2) having a naphthalene skeleton, represented by the following formula (II):

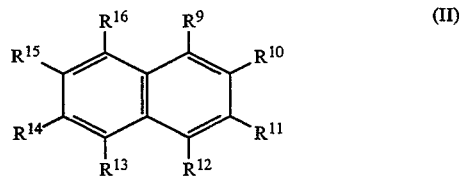

wherein two of $R^9$ to $R^{16}$ independently represent

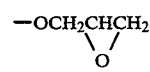

and those remaining independently represent hydrogen atom, halogen atom or a lower alkyl group having 1 to 4 carbon atoms,
   (ii) a curing agent, and (iii) a filler containing a fused silica (C) consisting of 97 to 50 wt % of crushed fused silica (C1) of a mean particle diameter not more than 10 μm and 3 to 50 wt % of spherical fused silica (C2) of a mean particle diameter not more than 4 μm, wherein the mean particle diameter of the spherical fused silica is smaller than the mean particle diameter of the crushed fused silica, and the amount of the filler being 75 to 90 wt % to the total of the composition.

3. A semiconductor device-encapsulating epoxy resin composition comprising:

(i) an epoxy resin (A) containing as an essential component thereof at least one of a bifunctional epoxy resin (a1) having a biphenyl skeleton represented by the following formula (I)

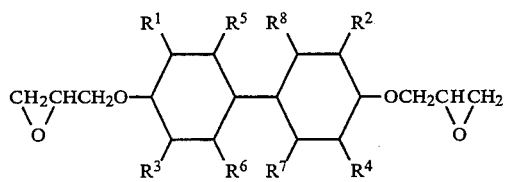

wherein $R^1$ to $R^8$ independently represent hydrogen, a halogen or a lower alkyl group having 1 to 4 carbon atoms, or a bifunctional epoxy resin (a2) having a naphthalene skeleton represented by the following formula (II)

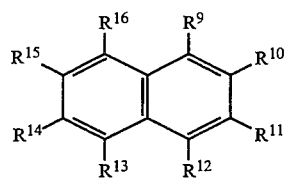

wherein two of $R^9$ to $R^{16}$ independently represent

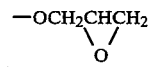

and those remaining independently represent hydrogen, a halogen or a lower alkyl group having 1 to 4 carbon atoms;

(ii) a phenolic curing agent (B), the amount of said epoxy resin (A) and said curing agent (B) being such that a chemical equivalent ratio of said curing agent (B) to said epoxy resin (A) is in a range of 0.7 to 1.3; and (iii) a filler containing a fused silica (C) consisting of 97 to 50 wt % of crushed fused silica (C1) of a mean particle diameter not more than 10 μm and 3 to 50 wt % of spherical fused silica (C2) of a mean particle diameter not more than 4 μm, wherein the mean particle diameter of the spherical fused silica is smaller than the mean particle diameter of the crushed fused silica, and the amount of the filler being 75 to 90 wt % to the total of the composition.

4. The composition according to claim 1, further containing a styrene block copolymer (D).

5. The composition according to claim 1, further containing a copolymer (E) of (1) at least one compound selected from the group consisting of ethylene and α-olefin and (2) at least one compound selected from the group consisting of an unsaturated carboxylic acid and derivatives thereof.

6. The composition according to claim 2, further containing a styrene block copolymer (D).

7. The composition according to claim 2, further containing a copolymer (E) of (1) at least one compound selected from the group consisting of ethylene and α-olefin and (2) at least one compound selected from the group consisting of an unsaturated carboxylic acid and derivatives thereof.

* * * * *

UNITED STATES PATENT AND TRADEMARK OFFICE
CERTIFICATE OF CORRECTION

PATENT NO. : 5,360,837
DATED : November 1, 1994
INVENTOR(S) : Shiro Honda et al

It is certified that error appears in the above-indentified patent and that said Letters Patent is hereby corrected as shown below:

Column 18:
    In Table 9, under the column "Ratio by Weight *1 (I/II/III/IV/V)" kindly delete the next to the last entry "0/0/0/100/0" and substitute --0/0/100/0/0--.

Signed and Sealed this

Eighteenth Day of April, 1995

Attest:

BRUCE LEHMAN

*Commissioner of Patents and Trademarks*

*Attesting Officer*

UNITED STATES PATENT AND TRADEMARK OFFICE
CERTIFICATE OF CORRECTION

PATENT NO. : 5,360,837
DATED : November 1, 1994
INVENTOR(S) : Shiro Honda, Yasushi Sawamura, Masayuki Tanaka, Keiji Hayaba and Toshihiro Teshiba It is certified that error appears in the above-indentified patent and that said Letters Patent is hereby corrected as shown below:

In Column 27, please delete formula (I) (spanning lines 20-25),

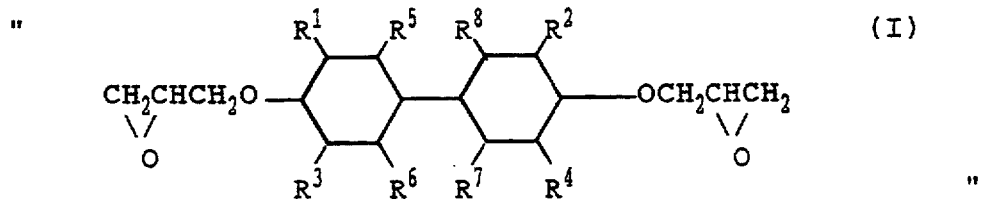

and substitute

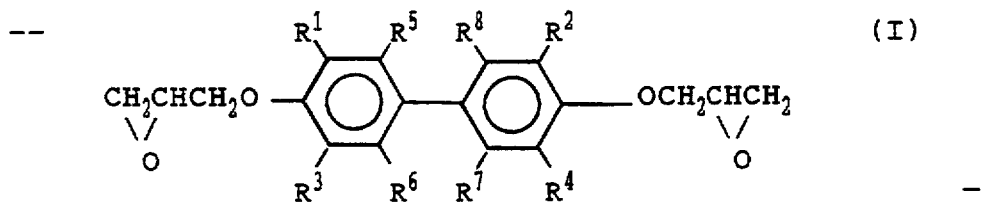

Signed and Sealed this

Twenty-ninth Day of August, 1995

Attest:

BRUCE LEHMAN

Attesting Officer     Commissioner of Patents and Trademarks